US006657288B2

United States Patent
Tandy

(10) Patent No.: US 6,657,288 B2
(45) Date of Patent: *Dec. 2, 2003

(54) COMPRESSION LAYER ON THE LEAD FRAME TO REDUCE STRESS DEFECTS

(75) Inventor: Patrick W. Tandy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/222,103

(22) Filed: Aug. 16, 2002

(65) Prior Publication Data

US 2003/0001246 A1 Jan. 2, 2003

Related U.S. Application Data

(63) Continuation of application No. 09/699,918, filed on Oct. 30, 2000, which is a continuation of application No. 09/298,301, filed on Apr. 23, 1999, now Pat. No. 6,140,695, which is a continuation of application No. 08/857,200, filed on May 15, 1997, now Pat. No. 5,923,081.

(51) Int. Cl.[7] .......................... H01L 23/48; H01L 23/28; H01L 29/44

(52) U.S. Cl. ........................ 257/669; 257/673; 257/676; 257/666; 257/700; 257/674; 257/783

(58) Field of Search .................................. 257/669, 673, 257/676, 666, 706, 674, 783, 668, 700, 677, 735, 640, 780, 786; 361/723, 772, 773, 818; 29/827, 841, 848, 854

(56) References Cited

U.S. PATENT DOCUMENTS

| 3,750,277 A | 8/1973 | Happ |
| 4,209,355 A | 6/1980 | Burns |
| 4,862,245 A | 8/1989 | Pashby et al. |
| 4,942,454 A | 7/1990 | Mori et al. |
| 4,984,059 A | 1/1991 | Kubota et al. |
| 5,016,084 A | 5/1991 | Nakao |
| 5,068,712 A | 11/1991 | Murakami et al. |
| 5,126,820 A | 6/1992 | Brown |
| 5,184,208 A | 2/1993 | Sakuta et al. |
| 5,227,661 A | 7/1993 | Heinen |
| 5,231,303 A | 7/1993 | Kasahara et al. |
| 5,233,220 A | 8/1993 | Lamson et al. |
| 5,250,841 A | 10/1993 | Sloan et al. |
| 5,252,853 A | 10/1993 | Michii |
| 5,260,234 A | 11/1993 | Long |
| 5,266,834 A | 11/1993 | Nishi et al. |
| 5,286,679 A | 2/1994 | Farnworth et al. |
| 5,304,842 A | 4/1994 | Farnworth et al. |
| 5,357,139 A | 10/1994 | Yaguchi et al. |

(List continued on next page.)

FOREIGN PATENT DOCUMENTS

| DE | 4313797 A1 | 2/1994 |
| JP | 1-207939 | 8/1989 |
| JP | 5-326814 | 12/1993 |

OTHER PUBLICATIONS

Louis T. Manzione; "AT&T Plastic Packaging of Microeletronic Devices"; 1990; pp. 156–347.

Caroline A. Kovac et al.; "Plastic Package Fabrication"; Electronic Materials Handbook, vol. 1 Packaging; 1989; pp. 470–482.

Primary Examiner—Alexander O. Williams
(74) Attorney, Agent, or Firm—TraskBritt

(57) ABSTRACT

An LOC die assembly includes a die dielectrically adhered to the underside of a lead frame. The active surface of the die underlying the attached lead frame is coated with a polymeric material such as polyimide. The underside of the lead frame overlying the die is coated with a layer of soft material, such as silver, which has a lower hardness than the coating on the active surface for absorbing point stresses. Penetration of stacked filler particles into the soft material reduces point stresses on the active die surface and disadhesion stresses on the lead frame components.

31 Claims, 8 Drawing Sheets

U.S. PATENT DOCUMENTS

| | | |
|---|---|---|
| 5,381,037 A | 1/1995 | Olivarez |
| 5,384,487 A | 1/1995 | Rostoker et al. |
| 5,418,189 A | 5/1995 | Heinen |
| 5,436,410 A | 7/1995 | Jain et al. |
| 5,461,255 A | 10/1995 | Chan et al. |
| 5,466,888 A | 11/1995 | Beng et al. |
| 5,474,958 A | 12/1995 | Djennas et al. |
| 5,521,432 A | 5/1996 | Tsuji et al. |
| 5,531,860 A | 7/1996 | Li |
| 5,545,921 A | 8/1996 | Conru et al. |
| 5,561,320 A | 10/1996 | Abbott et al. |
| 5,576,246 A | 11/1996 | Conru et al. |
| 5,608,260 A | 3/1997 | Carper et al. |
| 5,616,953 A | 4/1997 | King et al. |
| 5,619,065 A | 4/1997 | Kim |
| 5,684,328 A | 11/1997 | Jin et al. |
| 5,760,468 A | 6/1998 | King et al. |
| 5,789,804 A | 8/1998 | Matsuoka et al. |
| 5,886,399 A | 3/1999 | Ohsawa et al. |
| 5,923,081 A | 7/1999 | Tandy |
| 6,140,695 A | 10/2000 | Tandy |
| 6,221,695 B1 | 4/2001 | Tandy |
| 6,486,539 B1 * | 11/2002 | Tandy ........................ 257/669 |

* cited by examiner

COMPRESSION LAYER ON THE LEAD FRAME TO REDUCE STRESS DEFECTS

CROSS-REFERENCE TO RELATED APPLICATIONS

This application is a continuation of application Ser. No. 09/699,918, filed Oct. 30, 2000, now U.S. Pat. No. 6,486,539, issued Nov. 26, 2002, which is a continuation of application Ser. No. 09/298,301, filed Apr. 23, 1999, now U.S. Pat. No. 6,140,695, issued Oct. 31, 2000, which is a continuation of application Ser. No. 08/857,200, filed May 15, 1997, now U.S. Pat. No. 5,923,081, issued Jul. 13, 1999.

BACKGROUND OF THE INVENTION

1. Field of the Invention

This invention relates generally to the fabrication of semiconductor devices such as a "leads-over-chip" (LOC) die assembly. More specifically, the invention pertains to a method and apparatus for reducing the stress resulting from the lodging of filler particles present in plastic encapsulants between the undersides of the lead frame leads and the active surface of the die, an integrated circuit semiconductor device, in a die assembly encapsulated in plastic.

2. State of the Art

The use of LOC semiconductor die assemblies has become relatively common in the industry. This style or configuration of semiconductor device replaces a "traditional" lead frame with a central, integral support (commonly called a die-attach tab, paddle or island) to which the back surface of a semiconductor die is secured, with a lead frame arrangement wherein the dedicated die-attach support is eliminated and at least some of the leads extend over the active surface of the die. The die is then adhered to the lead extensions with an adhesive dielectric layer of some sort disposed between the undersides of the lead extensions and the die. Early examples of LOC assemblies are illustrated in U.S. Pat. No. 4,862,245 to Pashby et al. and U.S. Pat. No. 4,984,059 to Kubota et al. More recent examples of the implementation of LOC technology are disclosed in U.S. Pat. Nos. 5,068,712; 5,184,208; 5,233,220; 5,252,853; 5,227,661; 5,286,679; 5,304,842; 5,418,189; 5,461,255; 5,466,888; 5,545,921; and 5,576,246. In instances known to the inventors, LOC assemblies employ large quantities or horizontal cross-sectional areas of adhesive to enhance physical support of the die for handling.

Traditional lead frame die assemblies using a die-attach tab place the inner ends of the lead frame leads in close lateral proximity to the periphery of the active die surface where the bond pads are located, wire bonds then being formed between the lead ends and the bond pads. LOC die assemblies, by their extension of inner lead ends over the die, permit physical support of the die from the leads themselves as well as more diverse (including centralized) placement of the bond pads on the active surface, as well as the use of the leads for heat transfer from the die.

However, use of LOC die assemblies in combination with plastic packaging of the LOC die assembly, as known in the art, has demonstrated some shortcomings of LOC technology as presently practiced in the art.

By far the most common manner of forming a plastic package about a die assembly is molding, and specifically transfer molding. In this process (and with specific reference to LOC die assemblies), a semiconductor die is suspended by its active surface from the underside of inner lead extensions of a lead frame (typically Cu or Alloy 42) by a tape, screen print or spin-on dielectric adhesive layer. The bond pads of the die and the inner lead ends of the frame are then electrically connected by wire bonds (typically Au, although Al and other metal alloy wires have also been employed) by means known in the art. The resulting LOC die assembly, which may comprise the framework of a dual-in-line package (DIP), zig-zag in-line package (ZIP), small outline j-lead package (SOJ), quad flat pack (QFP), plastic leaded chip carrier (PLCC), surface mount device (SMD) or other plastic package configuration known in the art, is placed in a mold cavity and encapsulated in a thermosetting polymer which, when heated, reacts irreversibly to form a highly cross-linked matrix no longer capable of being re-melted.

The thermosetting polymer generally is comprised of three major components: an epoxy resin, a hardener including accelerators, and a filler material. Other additives such as flame retardants, mold release agents and colorants are also employed in relatively small amounts. While many variations of the three major components are known in the art, the focus of the present invention resides in the filler materials employed in the thermosetting polymer and their effects on the active die surface.

Filler materials are usually a form of fused silica, although other materials such as calcium carbonates, calcium silicates, talc, mica and clays have been employed for less rigorous applications. Powdered fused quartz is currently the primary filler used in encapsulants. Each of the above filler materials is a relatively hard material, particularly when compared to the die surface.

Fillers provide a number of advantages in comparison to unfilled encapsulants. For example, fillers reinforce the polymer and thus provide additional package strength, enhance thermal conductivity of the package, provide enhanced resistance to thermal shock, and greatly reduce the cost of the encapsulating material in comparison to unfilled polymer. Fillers also beneficially reduce the coefficient of thermal expansion (CTE) of the composite material by about fifty percent in comparison to the unfilled polymer, resulting in a CTE much closer to that of the silicon or gallium arsenide die. Filler materials, however, also present some recognized disadvantages, including increasing the stiffness of the plastic package and the moisture permeability of the package.

One previously unrecognized disadvantage discovered by the inventors herein is damage to the active die surface resulting from encapsulant filler particles becoming lodged or wedged between the underside of the lead extensions and the active die surface during transfer molding of the plastic package about the die and the inner lead ends of the LOC die assembly. The filler particles, which may literally be jammed in position due to deleterious polymer flow patterns and flow imbalances in the mold cavity during encapsulation, place the active die surface under residual stress at the points of contact of the particles. The hard particles may then damage the die surface or conductive elements thereon or immediately thereunder when the package is further stressed (mechanically, thermally, electrically) during post-encapsulation handling and testing.

While it is possible to employ a lower volume of filler in the encapsulating polymer to reduce potential for filler particle lodging or wedging, a drastic reduction in filler volume raises costs of the polymer to unacceptable levels. Currently available filler technology also imposes certain limitations as to practical beneficial reductions in particle size (currently in the 75 to 125 micron range, with the larger end of the range being easier to achieve with consistency) and in the shape of the filler particles. While it is desirable that particles be of generally spherical shape, it has thus far proven impossible to eliminate non-spherical flakes or chips which, in the wrong orientation, maximize stress on the die surface.

Ongoing advances in design and manufacturing technology provide increasingly thinner conductive, semiconductive and dielectric layers in state-of-the-art dice, and the width and pitch of conductors serving various purposes on the active surface of the die are likewise being continually reduced. The resulting die structures, while robust and reliable for their intended uses, nonetheless become more stress-susceptible due to the minimal strength provided by the minute widths, depths and spacings of their constituent elements. The integrity of active surface die coats such as silicon dioxide, doped silicon dioxides such as phosphorous silicate glass (PSG) or borophosphorous silicate glass (BPSG), or silicon nitride, may thus be compromised by point stresses applied by filler particles, the result being unanticipated shortening of device life if not immediate, detectable damage or alteration of performance characteristics.

The aforementioned U.S. Pat. No. 4,984,059 to Kubota et al. does incidentally disclose several exemplary LOC arrangements which appear to greatly space the leads over the chip or which do not appear to provide significant areas for filler particle lodging. However, such structures may create fabrication and lead spacing and positioning difficulties.

U.S. Pat. No. 5,436,410 to Jain et al. discloses methods for suppressing stress-induced defects in semiconductor leads. The specific problems addressed by Jain et al. do not include damage to the die by filler material particles, and their solution to lead damage is to provide a stress-reducing layer over the leads.

To the inventor's knowledge, those of ordinary skill in the art have failed to recognize the particular stress phenomenon attendant to transfer molding and the use of filled encapsulants, nor has the current state of the art provided a LOC structure which beneficially accommodates this phenomenon.

BRIEF SUMMARY OF THE INVENTION

The present invention provides a lead-supported die assembly for a LOC arrangement that substantially reduces the stress that may otherwise potentially form between the leads and the active die surface due to the presence of filler particles of the polymer encapsulant.

A layer of relatively soft material, i.e., less hard than the die active surface or its covering, is adhered to the underside of the leads overlying peripheral portions of the die. Filler particles in the encapsulant which may become stacked between portions of the die and the overlying lead portions preferentially penetrate the soft layer on the lead portions, thus protecting the die surface from damage.

The soft material may be a soft metal such as essentially pure silver or other relatively inert metal, or an alloy thereof. The soft material must be inert to avoid detrimental chemical reactions with other chemical species after encapsulation.

Alternatively, the soft material may be a polymer designed to have a low hardness, at least during the encapsulation process. The polymeric material hardness prior to encapsulation is less than about one-half the hardness of the die or any coating thereon. The polymer may subsequently harden, but has served its purpose in absorbing forces exerted by filler particles during encapsulation. The preferential penetration of filler particles into the soft material layer protects the die surface from damage.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

So that the reader may more fully understand the present invention in the context of the prior art, it seems appropriate to provide a brief description of a transfer apparatus and method for forming a plastic package about a leads-over-chip (LOC) die assembly. The term "transfer" molding is descriptive of this process as the molding compound (encapsulant), once melted, is transferred under pressure to a plurality of remotely located mold cavities containing die assemblies to be encapsulated.

Figure 1:
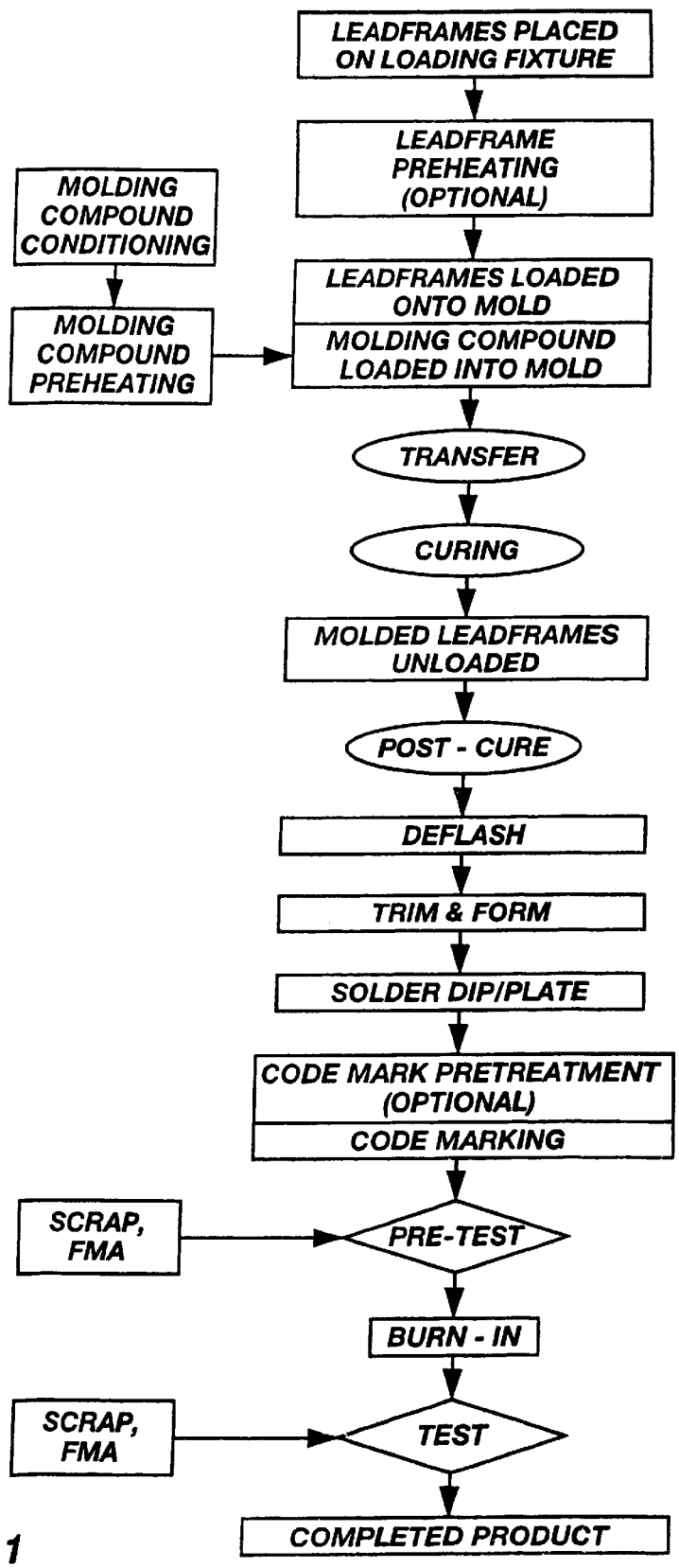
FIG. 1 is a flow chart of an exemplary process sequence for plastic package molding of the prior art.

FIG. 1 depicts the typical process sequence for plastic package molding. It should be noted that the solder dip/plate operation has been shown as one step for brevity; normally, coating would occur prior to the "trim and form" step.

Figure 2A:
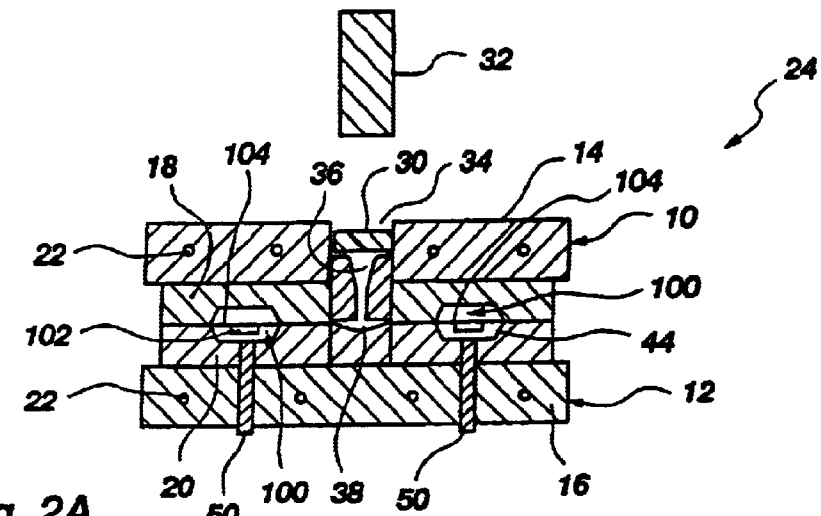
FIG. 2A is a schematic side view of a typical transfer molding of the prior art, showing a pre-molding encapsulant position.
Figure 2B:
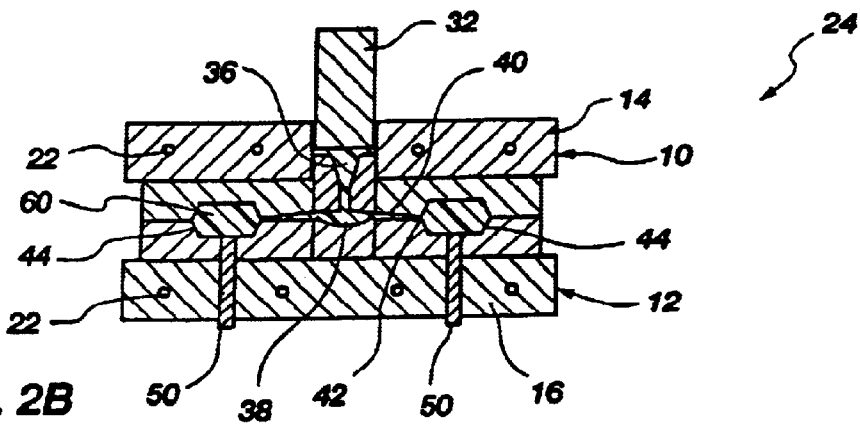
FIG. 2B is a schematic side view of a typical transfer molding of the prior art, showing a post-molding encapsulant position.

FIGS. 2A and 2B show pre-molding and post-molding positions of encapsulant 30 during a transfer molding operation using a typical mold apparatus 24 comprising upper and lower mold halves 10 and 12, each mold half including a platen 14 or 16 with its associated chase 18 or 20. Heating elements 22 are employed in the platens 14, 16 to maintain an elevated and relatively uniform temperature in the runners 38, 40 and mold cavities 44 during the molding operation.

Figure 3:
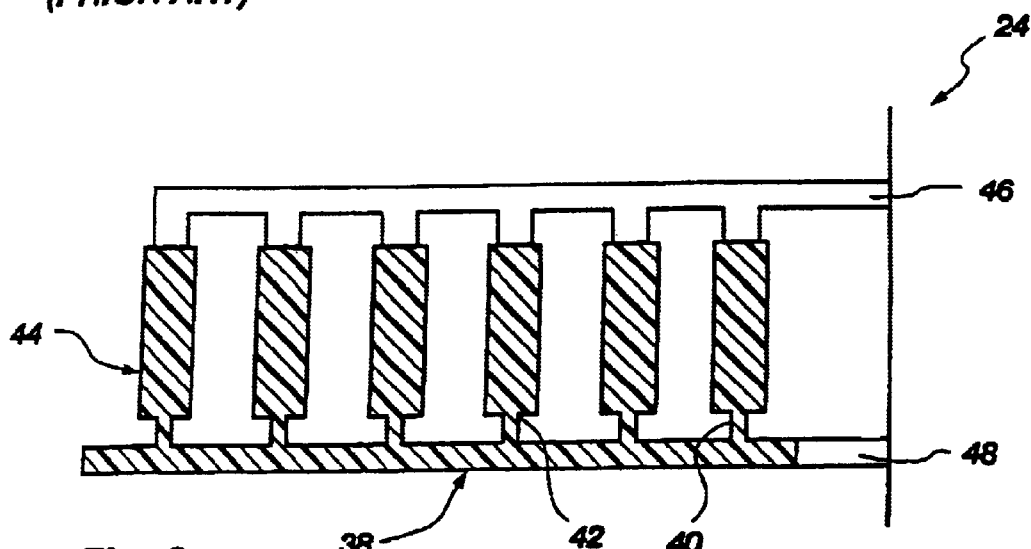
FIG. 3 is a schematic plan view of one side of a transfer mold of FIGS. 2A and 2B, depicting encapsulant flow and venting of the primary mold runner and the mold cavities in which the die assemblies are contained.

FIG. 3 is a top view showing one side of the transfer mold apparatus 24 of FIGS. 2A and 2B. A die assembly 100 is placed in each mold cavity 44 for encapsulation. In the transfer mold apparatus 24 shown, the encapsulant (resin mold compound) 30 flows into each mold cavity 44 through the short end.

As illustrated in FIGS. 2A, 2B and 3, the operation of encapsulation is as follows. A heated pellet of resin mold compound or encapsulant 30 is disposed beneath ram or plunger 32 in pot 34. The plunger 32 is forced downwardly, melting the pellet and forcing the melted encapsulant 30 down through sprue 36 and into primary runner 38. The melted encapsulant 30 then travels to transversely oriented secondary runners 40 and across gates 42 into and through the mold cavities 44, flowing across the die assemblies 100. Each die assembly 100 is within a mold cavity 44, and comprises a die 102 with an attached lead frame 104. The die assemblies 100 are typically disposed in strips so that a strip of, e.g., six lead frames 104 (see FIGS. 4A, 4B) may be cut and placed in and across the six cavities 44 shown in FIG. 3.

Air in the primary runners 38, secondary runners 40 and mold cavities 44 is vented to the atmosphere through vents 46 and 48. At the end of the molding operation, the encapsulant 30 is "packed" by application of a higher pressure to eliminate voids and reduce non-uniformities of the encapsulant in the mold cavities 44. After molding, the encapsulated die assemblies 60 are ejected from the cavities 44 by ejector pins 50, after which they are post-cured at an elevated temperature to complete cross-linking of the encapsulating thermoset resin, followed by other operations as known in the art and set forth in FIG. 1 by way of example.

It will be appreciated that other transfer molding apparatus configurations, as well as variations in details of the described method, are known in the art. However, the instant invention is applicable irrespective of the particular details of the transfer molding operation, and such alternate encapsulating procedures will be discussed herein only to the extent that they may affect the invention.

Figure 4A:
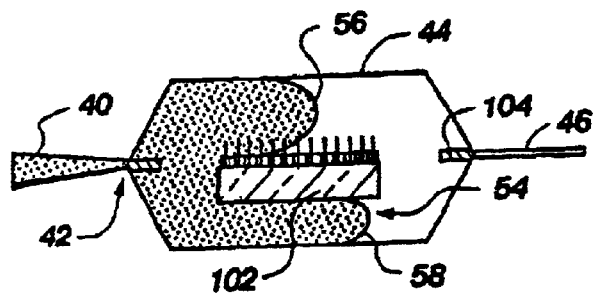
FIG. 4A is a schematic side view of a transfer mold of the prior art, depicting encapsulant flow about a die assembly.
Figure 4B:
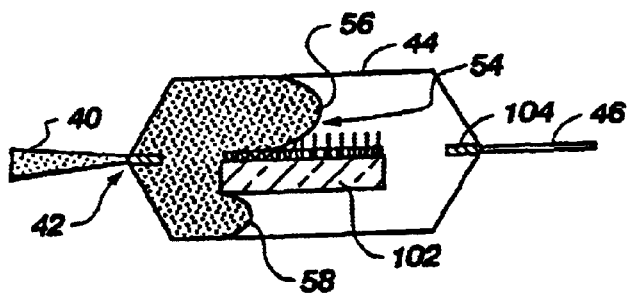
FIG. 4B is a schematic side view of a transfer mold of the prior art, depicting encapsulant flow about a die assembly wherein wire bonds are subjected to "wire sweep"
Figure 4C:
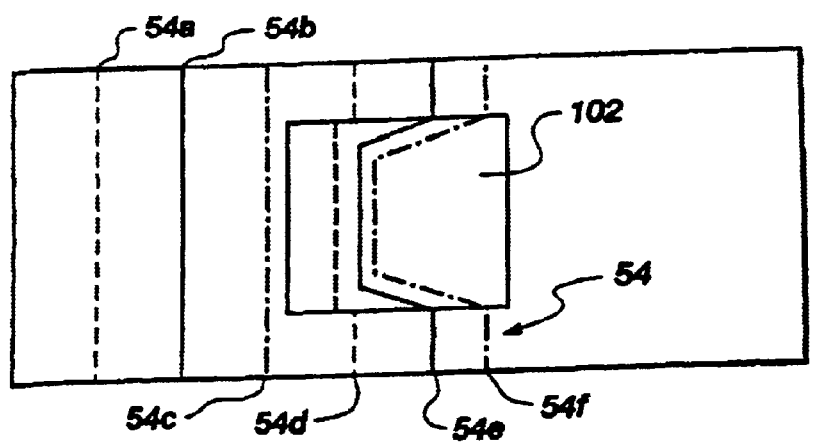
FIG. 4C is an enlarged schematic top view of a transfer mold of the prior art, depicting the progressive encapsulant flow about a die assembly.

The flow of encapsulant 30 in the mold cavities 44 is demonstrably non-uniform. As depicted in FIGS. 4A, 4B, and 4C, the presence of the die assembly 100 comprising a die 102 with lead frame 104 disposed across the mid-section of a cavity 44 splits the viscous encapsulant flow front 54 into upper 56 and lower 58 components. Further, the presence of the (relatively) large die 102 with its relatively lower temperature in the middle of a cavity 44 permits the flow front 54 on each side of the die 102 to advance ahead of the front which passes over and under the die 102. FIGS. 4A and 4B show two mold cavity encapsulant flow scenarios where, respectively, the lower flow front 58 and the upper flow front 56 lead the overall encapsulant flow front 54 in the cavity 44 containing the die assembly 100. FIG. 4C depicts the advance of a typical flow front 54 from above, before and after a die 102 is encountered, the flow being depicted as time-separated instantaneous flow fronts 54A, 54B, 54C, 54D, 54E and 54F.

Figure 5A:
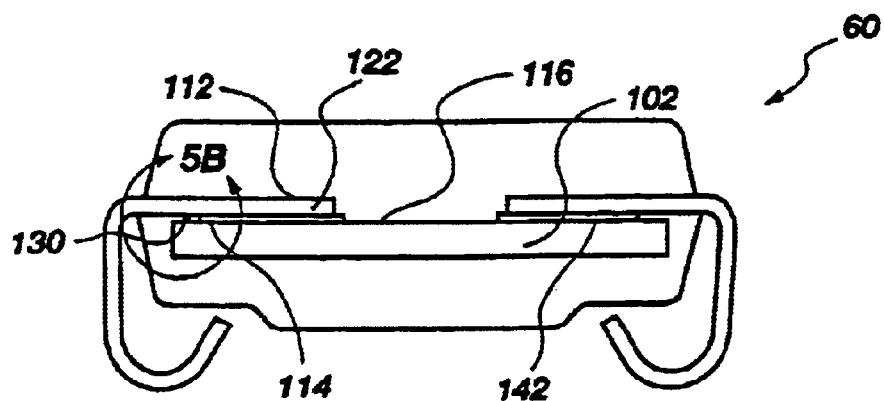
FIG. 5A is a cross-sectional side view of a prior art packaged SOJ semiconductor device.
Figure 5B:
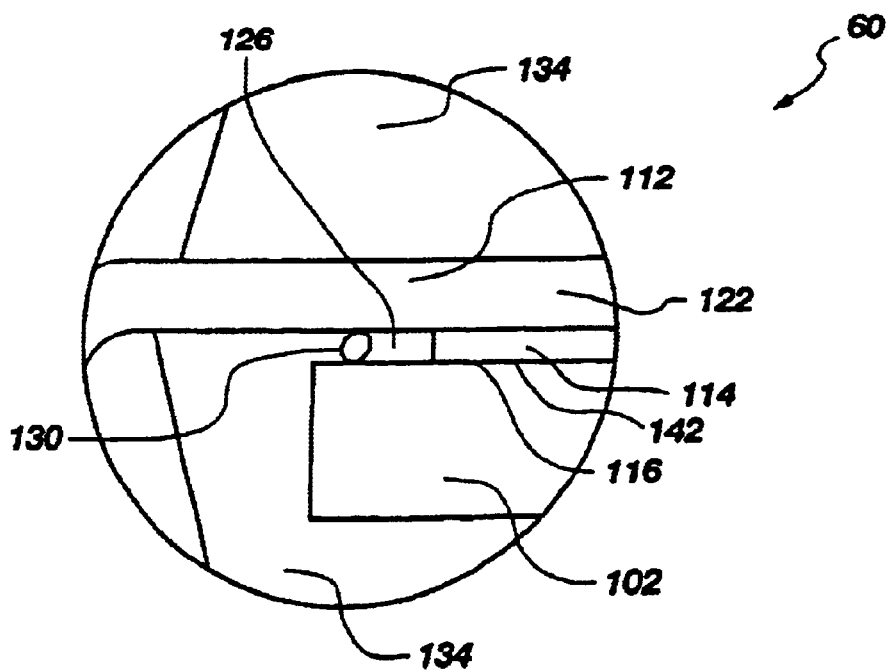
FIG. 5B is an enlarged cross-sectional side view of a prior art packaged SOJ semiconductor device.

FIGS. 5A and 5B depict a packaged LOC assembly 60 formed by transfer molding, wherein hard filler particles 130 incorporated in the encapsulant become lodged between lead ends 122 and the underlying die active surfaces 116 of the die 102. The non-uniform flow characteristics of the viscous encapsulant 30, as described above, may cause (in addition to other phenomena such as wire sweep, which this invention does not address) particles 130 to be more forcefully driven into the spaces 126 between the leads 112 and the die 102 and wedged or jammed in place in low-clearance areas. As the encapsulant flow front 54 advances (see FIG. 4C) and the mold operation is completed by packing the cavities or spaces 126, pressure in substantially all portions of the cavities reaches hydrostatic. With prior art lead and adhesive LOC arrangements, the relative inflexibility of the tightly constrained (adhered) lead ends 122 maintains the point stresses of the particles 130 trapped under the leads 112. These residual stresses are carried forward in the fabrication process to post-cure and beyond. When mechanical, thermal, or electrical stresses attendant to post-encapsulation processing are added to the residual point stresses associated with the lodged filler particles 130, cracking or perforation of the die coat 142 may occur, with the adverse effects previously noted.

It has been observed that filler particle-induced damage to a die active surface 116 occurs more frequently in close proximity to the dielectric adhesive 114, where lead flexure potential is at its minimum.

To graphically illustrate the above description of particle lodging, FIG. 5A depicts a prior art packaged LOC assembly 60 wherein a single lead 112 extends over a die 102, with a segment of dielectric adhesive 114, in this instance a piece of polyimide tape, adhered to both the lead 112 and the active surface 116 of the die. As better illustrated in FIG. 5B, filler particle 130, which is part of the packaging material 134, is lodged between lead 112 and die active surface 116. It is clear that the lead end 122 is tightly constrained from movement by the inflexibility of the attachment of the lead end 122 to the die 102 by adhesive 114. Moreover, the relative closeness of the lead 112 to the die active surface 116 and the inability of the lead 112 to flex or relax to reduce stress occasioned by the presence of the filler particle 130 may continue even after the encapsulant has reached hydrostatic balance, such that the filler particle may become tightly lodged and wedged between the lead 112 and the die active surface 116.

The present invention described below provides relief from the particle caused stresses in the die, as well as in the lead 112.

Figure 6A:
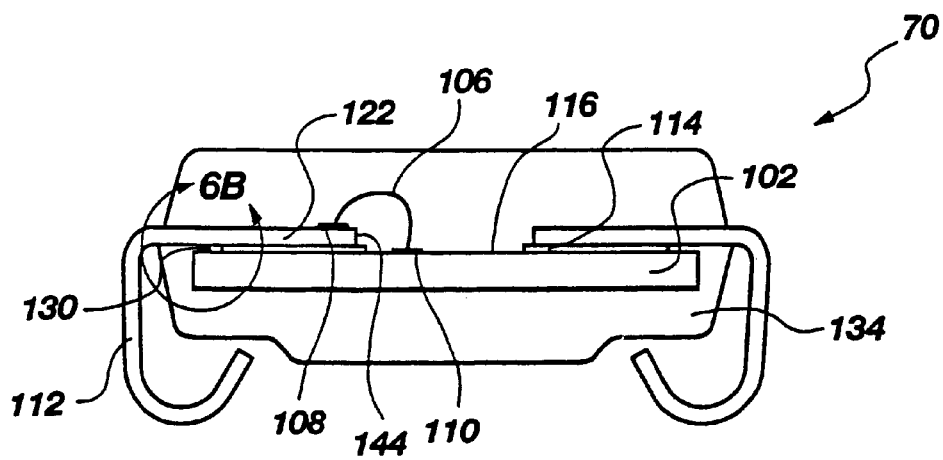
FIG. 6A is a cross-sectional side view of a packaged SOJ semiconductor device of the invention.
Figure 6B:
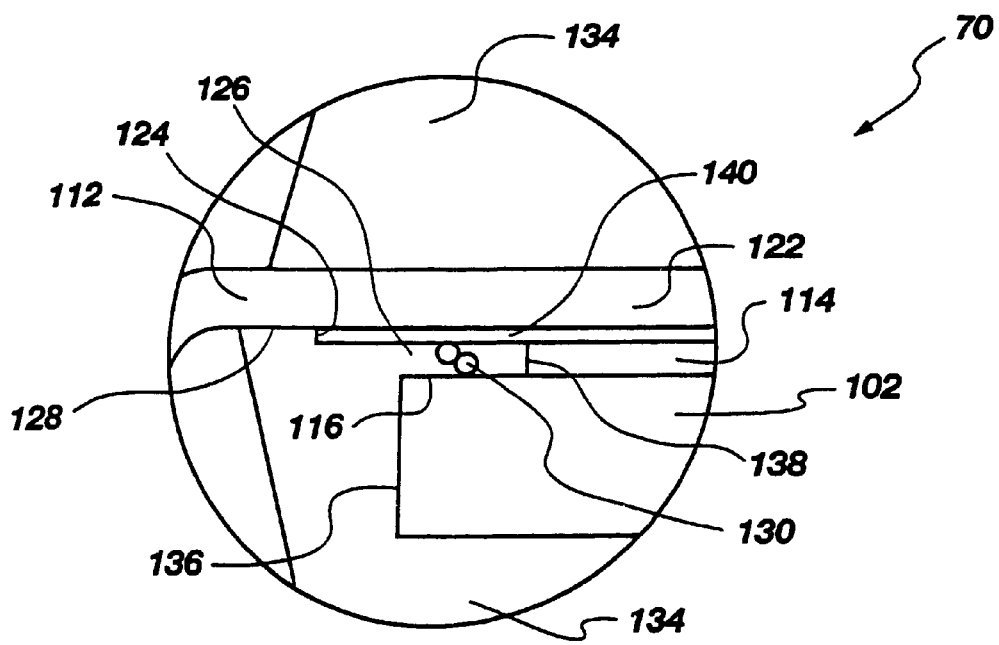
FIG. 6B is an enlarged cross-sectional side view of the packaged SOJ semiconductor device of FIG. 6A.

As shown in FIGS. 6A and 6B, a packaged LOC semiconductor device 70 of the invention comprises at least one lead end 122 of lead 112, the lead end extending over and spaced from die 102. For the sake of simplicity, a single bond wire 106 between a bond site 108 on a lead end 122 and a bond pad 110 on the active surface 116 of die 102 is shown. More typically, each of a plurality of lead ends 122 is conductively attached to a bond pad 110 by, e.g., a thin gold bond wire 106.

Alternatively, the conductive connections between the die 102 and the lead ends 122 may be by tape automated bonding (TAB), whereby the lead ends are bonded directly to bond pads 110 by methods known in the art.

Each of the lead ends 122 is shown attached to the die 102 by an intervening layer 114 of dielectric adhesive, which may be, e.g., a polyimide film or adhesive tape such as KAPTON™ tape, a trademark of DuPont.

The undersurface 128 of the lead end 122 is relatively hard when compared to the die active surface 116 which is typically a glass. During encapsulation of the semiconductor device 70, particles 130 of filler material in the encapsulant are forced by the flow front of encapsulant into the initial space or recess 126 between the lead end 122 and the die active surface 116 along the outer edge 136 of the die 102. Pressure of the hard particles 130 against the die active surface 116 occasionally leads to damage of the die 102.

In accordance with this invention, such damage to the die 102 is eliminated or greatly reduced by a displaceable stress relief layer 140 (also called a displaceable layer herein) which is attached to the undersurface 128 of the lead end 122 (see FIG. 6B). While the stress relief layer 140 need only extend from the outer edge 138 of the dielectric adhesive 114 to the outer edge 136 of the die 102, it may extend further inward to the inner ends 144 of the leads 112, and be an intervening layer between the lead undersurface 128 and the layer 114 of dielectric adhesive. As will be described below, an advantage of such extension is that when the stress relief layer 140 is formed of elemental silver or similar metal/alloy, the bond between the lead ends 122 and the dielectric adhesive layer 114 is believed to be significantly enhanced, thus avoiding debonding which occasionally occurs in the prior art.

The stress relief layer 140 may also extend outwardly away from the outer edge 136 of the die 102 to ensure full coverage over the space or recess 126. However, such extension is preferably only a short distance, particularly when the stress relief layer 140 comprises a costly metal. Thus, at one extreme, the stress relief layer 140 may cover the undersurface 128 of the lead end 122 adjacent the space or recess 126 only. At the other extreme, the stress relief layer 140 may cover the entire undersurface 128 of the lead 112. Depending upon the particular application and the composition of the stress relief layer 140, a preferred embodiment typically includes a soft material layer covering the undersurface 128 adjacent both space or recess 126 and the dielectric adhesive layer 114.

As indicated above, the stress relief layer 140 comprises soft material on the undersurface 128 of the lead end 122. The stress relief layer 140 absorbs the energy of impinging filler particles 130. Thus, a particle or particles 130 forcibly entering the space 126 between the die 102 and the lead end 122 will preferentially penetrate the soft material layer 140.

The soft material of the stress relief layer 140 has preferentially less than about one-half the hardness value of the opposing surface, e.g., die active surface 116, contacted by the hard filler particles 130. However, the stress relief layer 140 must have a hardness value sufficient to prevent sloughing off of soft material therefrom. Typically, a hardness of about 0.05 to about 0.5 times that of the die active surface 116 is preferred. Expressed in another form, the Brinell hardness of the stress relief layer 140 will be less than about 40–50 but at least about 5–10 Brinnel units.

It should be noted that the particular desired property of the stress relief layer 140 is, in actuality, the ease with which it may be penetrated by a hard object. Hardness, as measured by the Brinell or other scale, is a convenient and fairly accurate measure of this property, but other properties which reflect penetrability may be alternatively specified.

The material of the stress relief layer 140 may be a soft metal such as essentially pure silver or other relatively inert metal, or an alloy thereof with a generally low hardness, including pure metals such as palladium and platinum and their alloys. The soft material must be generally inert under manufacturing, encapsulating and post-encapsulation conditions to avoid detrimental chemical reactions with other chemical species during and following encapsulation. Because of this restriction, together with cost considerations, the number of possible metals which may find practical use as a stress relief layer 140 is limited. However, silver has been found to be an excellent material for the stress relief layer 140 in terms of hardness (about 25–35 Brinell units), chemical resistance, and cost.

Furthermore, silver plating is typically used as an external protective layer over the, e.g., aluminum lead frame following its manufacture and prior to bonding it to the die 102. Ordinarily, most or all of the silver is removed by, e.g., etching prior to die-to-lead frame bonding to enhance bonding and/or for silver recovery. Although silver may be left on the wire bond sites to enhance electrical connection, a silver oxide layer may form on the silver, resulting in wire bonds of lower strength. Thus, in general practice, all of the silver coating may be removed prior to die-to-lead frame bonding. The very thin layer of silver oxide on the silver plate does not significantly increase the hardness value for the purposes of this invention.

In the instant invention, the preferred method includes removal of all (or nearly all) silver from the lead frame 104 except that which is to form the stress relief layer 140. The thickness of the silver stress relief layer 140 is generally about one to five microns, which is sufficient to provide the opportunity for relatively deep penetration by filler particles 130. Of course, the preferred thickness is the minimum which will provide the desired protection of the die 102.

The metal stress relief layer 140 may also be attached to the undersurface 128 of the lead end 122 by adhesive.

In an alternative embodiment, the soft material of the stress relief layer 140 may be a polymer designed to have a low hardness, at least during the encapsulation process. Such polymers are known and include epoxies, polyimides, acrylics, and silicones. The polymeric material hardness prior to encapsulation is less than about one-half the hardness of the die 102 or the coating thereon. The polymeric stress relief layer 140 may subsequently harden further by, e.g., post-encapsulation thermal treatment, but will have served its purpose in absorbing forces exerted by filler particles 130 during the encapsulant injection step. The preferential penetration of filler particles 130 into the stress relief layer 140 protects the die surface from both immediate and subsequent damage.

An additional advantage of using a stress relief layer 140 formed of a soft polymer is the additional electrical insulation provided thereby. Use of such a stress relief layer 140 may make possible a decrease in the required thickness of the adhesive layer 114, e.g. dielectric tape.

Figure 7A:
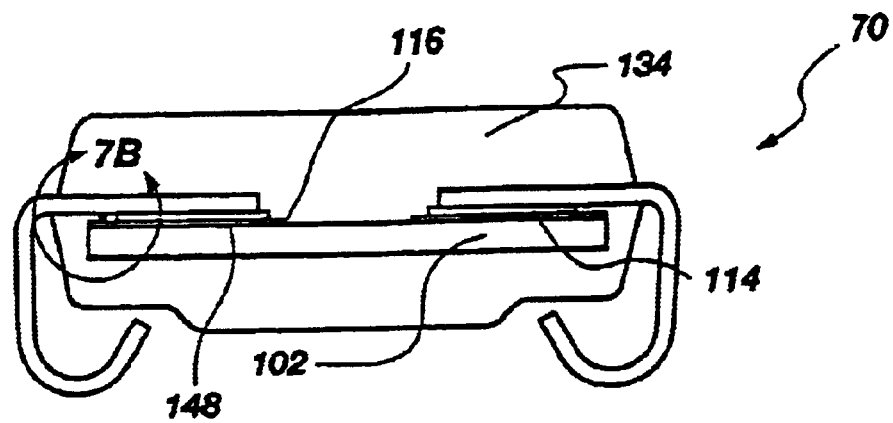
FIG. 7A is a cross-sectional side view of another embodiment of a packaged SOJ semiconductor device of the invention.
Figure 7B:
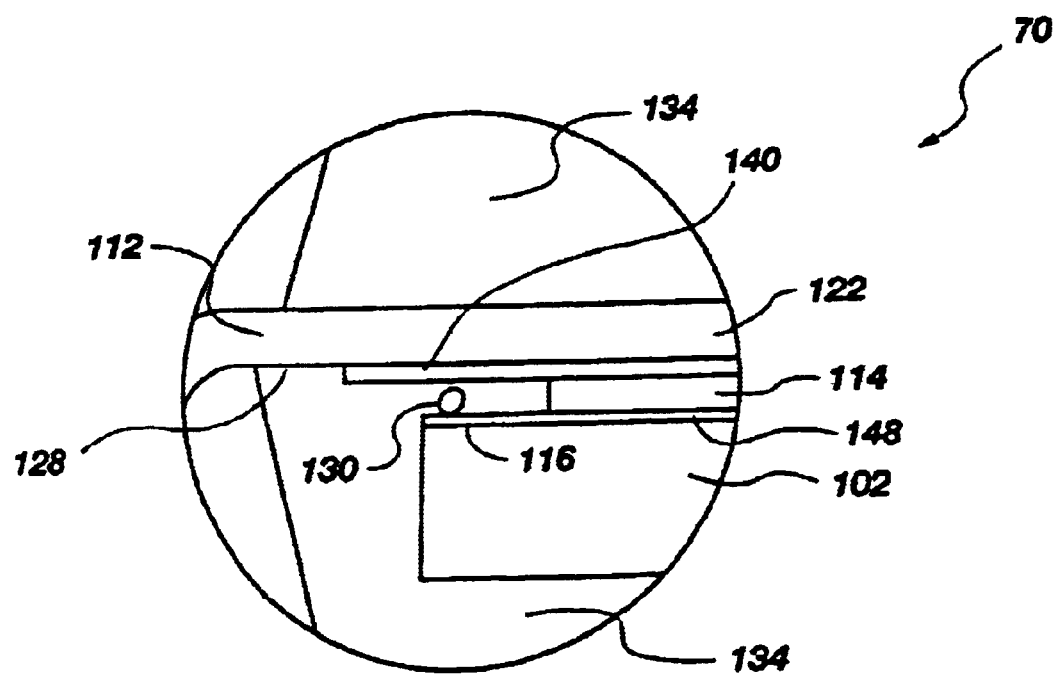
FIG. 7B is an enlarged cross-sectional side view of the packaged SOJ semiconductor device of FIG. 7A.

The embodiment of the invention illustrated in the drawings of FIGS. 7A and 7B differs from that of FIGS. 6A and 6B only in that a coating 148 of adhesive dielectric material is applied to non-wirebonding areas of the active surface 116 of die 102 prior to attachment of the dielectric adhesive layer 114 thereto. While this coating 148 provides a degree of protection to the die active surface 116, it has been found that the hard filler particles 130 nevertheless may penetrate the coating or high forces may be transmitted through the coating and damage the die surface. In accordance with this invention, a stress relief layer 140 is fixed on the undersurface 128 of the leads 112 and absorbs stresses which are otherwise placed upon and through the coating 148 to the die active surface 116. The stress relief layer 140 has a hardness value of less than about one-half of the hardness value of the coating 148.

Figure 8:
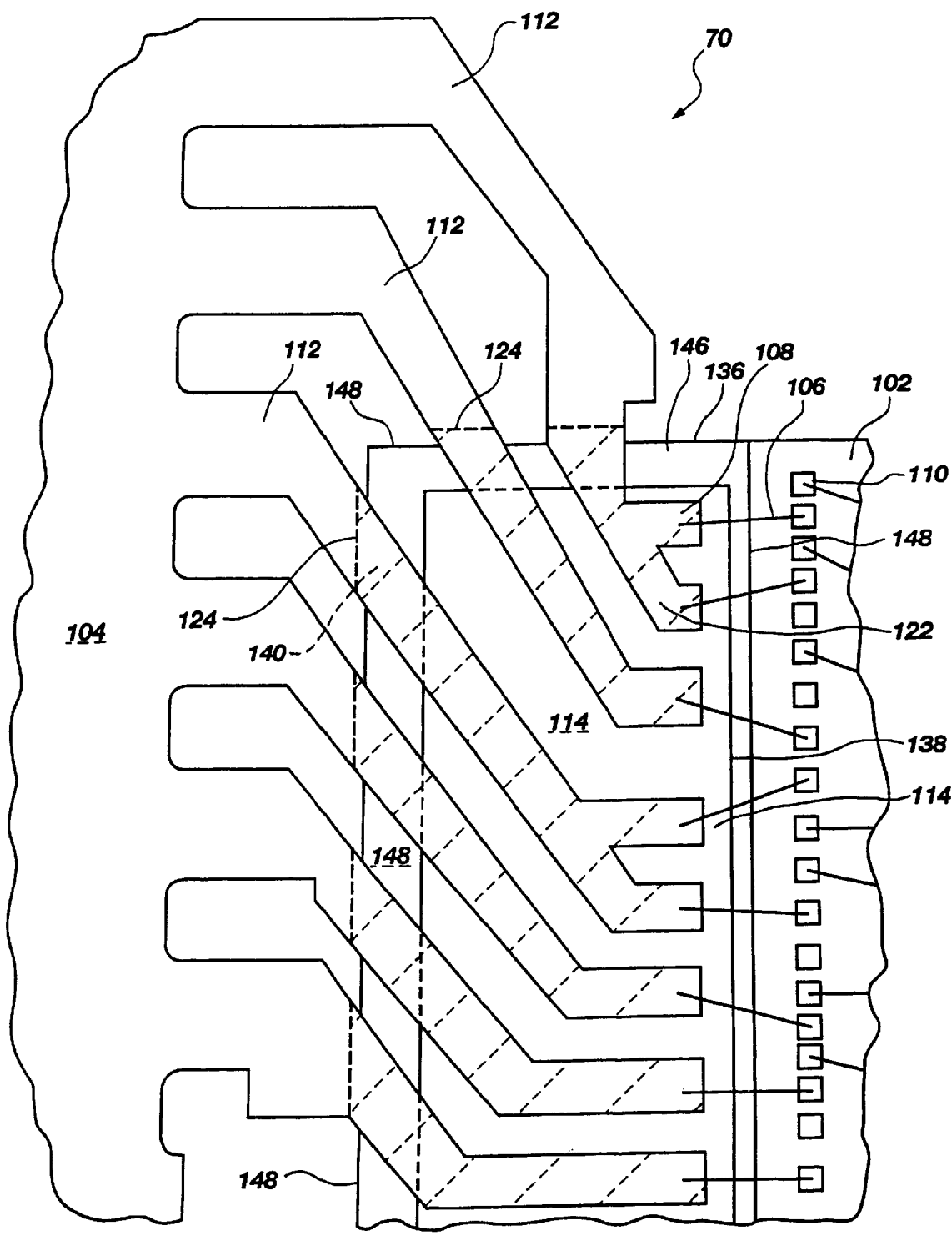
FIG. 8 is a plan view of a die-lead frame assembly of a semiconductor device of the invention.

FIG. 8 shows a portion of a LOC semiconductor device 70 as described above in relation to FIGS. 7A and 7B, including die 102 with bond pads 110 and a lead frame 104 with leads 112 extending over peripheral portions of the die. Conductive bond wires 106 are shown connecting bond pads 110 with bond sites 108 on the lead ends 122. The outer edge 136 of the die 102, the outer edge 146 of the coating 148, the outer edge 138 of adhesive layer 114 overlying the coating 148, and the outer edge 124 (first shown in FIG. 6B) of the stress relief layer 140 (on the undersurface of the leads 112) are shown as typically configured. The portion of the leads 112 having a stress relief layer 140 on the undersurface thereof is shown as hatched in both FIGS. 8 and 9.

Figure 9:
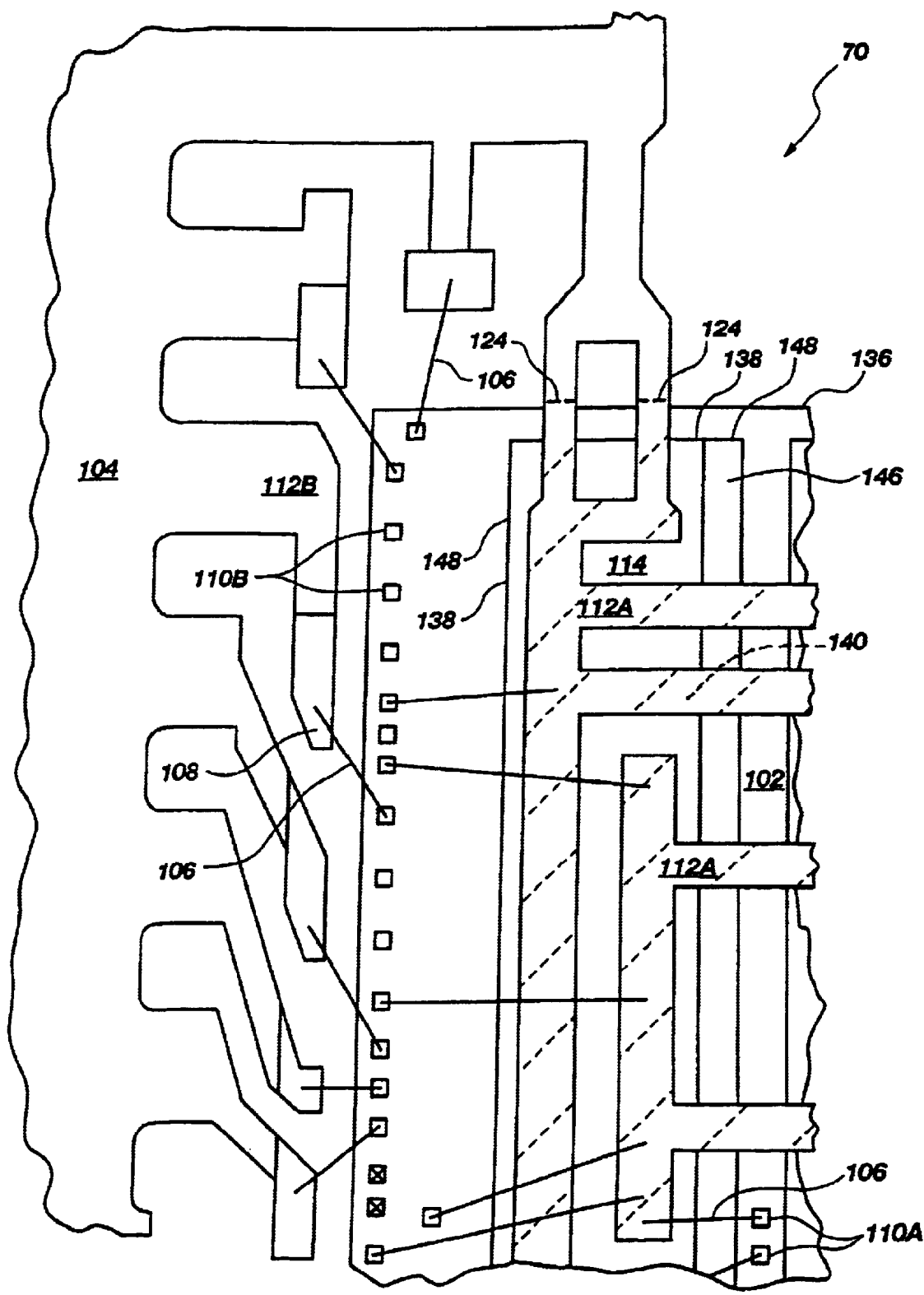
FIG. 9 is a plan view of another embodiment of a die-lead frame assembly of a semiconductor device of the invention.

A stress relief layer 140 of the invention is useful for any device configuration in which at least one lead overlies, faces, and is spaced from the die surface to create a recess therebetween. Thus, FIG. 9 depicts a different LOC semiconductor device 70 in which the leads 112A overlying the die 102 are in the central portion of the die, while leads 112B not adhered to the die are connected by wires to peripheral bond pads 110B. Typically, leads 112A comprise bus bars. The outer edge 136 of the die 102, the outer edge 146 of the coating 148, the outer edge 138 of adhesive layer 114 overlying the coating 148, and the outer edge 124 of the stress relief layer 140 (on the undersurface of the leads 112) are shown as typically configured for this type of LOC die-to-lead frame attach.

In a test comparing the penetration and hardness of a polyimide layer and a silver plate sample, a pyramidal indenter was impinged onto the sample at a peak load of 5 grams. The polyimide layer was penetrated to about 0.7 microns and the silver plate sample was penetrated to about 1.1 microns. Calculation of microhardness by the Vickers method indicated that the hardness of the polyimide surface was about 2.5 times that of the silver plate. By way of summary, the advantages of using a stress relief layer of the invention include:

a. a reduction in process steps in manufacturing the lead frame;

b. a reduction in contamination matter being stripped from the lead frame and being subsequently redeposited during the process of stripping silver from the backsurface of the lead frame;

c. permits the use of thinner polyimide tape for LOC packages;

d. permits thinner polyimide coatings;

e. may result in better adhesion between the compound/compression layer/lead frame interface, enhancing reliability; and f. may offer improved adhesion between the lead frame and the die attach material.

The present invention has been disclosed in terms of certain preferred embodiments as illustrated and described herein. However, those of ordinary skill in the art will recognize and appreciate that it is not so limited, and that various additions, deletions and modifications to, and combinations of, the disclosed embodiments may be effected without departing from the scope of the invention as hereinafter claimed. Further, the invention is not limited to a particular arrangement of leads, or to a particular lead cross-section or configuration.

What is claimed is:

1. An assembly comprising:

a semiconductor die having an active surface;

a lead frame including a plurality of lead members, at least a portion of said plurality of lead members having a lead end portion connected to a portion of said lead frame and having a free end portion extending over a portion of said active surface of said semiconductor die; and a deformable stress relief layer comprised of material attached to a portion of an undersurface of said free end portion of said at least a portion of said plurality of lead members.

2. The assembly of claim 1, further comprising:

a layer of material covering a portion of said active surface of said semiconductor die.

3. The assembly of claim 2, wherein said deformable stress relief layer comprises a material having a hardness value less than a hardness value of said layer of material covering a portion of said active surface of said semiconductor die.

4. The assembly of claim 1, wherein said semiconductor die comprises a leads-over-chip (LOC) die.

5. The assembly of claim 2, wherein said deformable stress relief layer comprises a material having a Brinnel Hardness Value (BHV) of less than about one-half a BHV of said layer of material covering a portion of said active surface of said semiconductor die.

6. The assembly of claim 2, wherein said deformable stress relief layer comprises a material having a Brinnel Hardness Value (BHV) of about 0.05 to 0.5 times a BHV of said layer of material covering a portion of said active surface of said semiconductor die.

7. The assembly of claim 1, wherein portions of said active surface of said semiconductor die underlying at least two lead members of said plurality of lead members includes a coating of an insulative material, and said deformable stress relief layer of material comprises a material having a Brinnel Hardness Value (BHV) of about 0.05 to 0.5 times a BHV of said insulative material.

8. The assembly of claim 1, wherein said deformable stress relief layer comprises a material having a Brinnel hardness value of about 5 to about 100.

9. The assembly of claim 1, wherein said deformable stress relief layer comprises a material having a Brinnel hardness value of about 10 to about 60.

10. The assembly of claim 1, wherein said deformable stress relief layer comprises a soft metal comprising one of silver, palladium and platinum.

11. The assembly of claim 1, wherein said deformable stress relief layer comprises a soft alloy comprising at least one metal selected from the group consisting of silver, palladium, and platinum.

12. The assembly of claim 1, wherein said deformable stress relief layer comprises a silver plating.

13. The assembly of claim 1, wherein said deformable stress relief layer comprises an intervening layer between at least two lead members of said plurality of lead members and said active surface of said semiconductor die.

14. The assembly of claim 1, wherein said deformable stress relief layer has a thickness of about one to about five microns.

15. The assembly of claim 1, wherein said deformable stress relief layer comprises a polymer.

16. The assembly of claim 15, wherein said deformable stress relief layer of polymer is configured to increase in hardness during post-encapsulation heat treatment.

17. An assembly comprising:

a semiconductor die having an active surface, a dielectric layer covering at least a portion of said active surface of said semiconductor die;

a lead frame including a plurality of lead members, at least a portion of said plurality of lead members having a lead end portion connected to a portion of said lead frame and having a free end portion having, in turn, an undersurface facing extending over a portion of said active surface of said semiconductor die; and a deformable stress relief layer of material attached to a portion of said undersurface of said free end portion of each of said at least a portion of said plurality of lead members, said deformable stress relief layer of material comprising a material having a hardness value less than a hardness value of said dielectric layer covering said at least a portion of said active surface of said semiconductor die.

18. The assembly of claim 17, wherein said semiconductor die comprises a leads-over-chip (LOC) die.

19. The assembly of claim 17, wherein said deformable stress relief layer of material comprises a material having a Brinnel Hardness Value (BHV) of less than about one-half a BHV of said dielectric layer covering said at least a portion of said active surface of said semiconductor die.

20. The assembly of claim 17, wherein said deformable stress relief layer of material comprises a material having a Brinnel Hardness Value (BHV) of about 0.05 to 0.5 times a BHV of said dielectric layer covering said at least a portion of said active surface of said semiconductor die.

21. The assembly of claim 17, wherein said deformable stress relief layer of material comprises a material having a Brinnel Hardness Value (BHV) of about 0.05 to 0.5 times a BHV of said dielectric layer.

22. The assembly of claim 17, wherein said deformable stress relief layer of material comprises a material having a Brinnel hardness value of about 5 to about 100.

23. The assembly of claim 17, wherein said deformable stress relief layer of material comprises a material having a Brinnel hardness value of about 10 to about 60.

24. The assembly of claim 17, wherein said deformable stress relief layer of material comprises a soft metal of at least one of the group consisting of silver, palladium, and platinum.

25. The assembly of claim 17, wherein said deformable stress relief layer of material comprises a soft alloy comprising at least one metal selected from the group consisting of silver, palladium, and platinum.

26. The assembly of claim 17, wherein said deformable stress relief layer of material comprises a layer of silver.

27. The assembly of claim 17, wherein said deformable stress relief layer of material comprises an intervening layer between at least two lead members of said plurality of lead members and said dielectric layer covering said at least a portion of said active surface of said semiconductor die.

28. The assembly of claim 17, wherein said deformable stress relief layer of material has a thickness of about one to about five microns.

29. The assembly of claim 17, wherein said deformable stress relief layer of material comprises a polymer having a hardness less than said hardness value of said dielectric layer.

30. The assembly of claim 29, wherein said polymeric deformable stress relief layer of material is configured to increase in hardness during post-encapsulation heat treatment.

31. The assembly of claim 2, further comprising a layer of dielectric adhesive placed between and connecting at least two lead members of said plurality of lead members to said layer of material covering a portion of said active surface of said semiconductor die.

* * * * *